(12) United States Patent
Chiu et al.

(10) Patent No.: US 8,441,333 B2
(45) Date of Patent: May 14, 2013

(54) STACK INDUCTOR WITH DIFFERENT METAL THICKNESS AND METAL WIDTH

(75) Inventors: Tzuyin Chiu, Shanghai (CN); Xiangming Xu, Shanghai (CN); Miao Cai, Shanghai (CN)

(73) Assignee: Shanghai Hua Hong NEC Electronics Company, Limited, Shanghai (CN)

( * ) Notice: Subject to any disclaimer, the term of this patent is extended or adjusted under 35 U.S.C. 154(b) by 0 days.

(21) Appl. No.: 12/958,080

(22) Filed: Dec. 1, 2010

(65) Prior Publication Data

US 2011/0133875 A1  Jun. 9, 2011

(30) Foreign Application Priority Data

Dec. 8, 2009  (CN) .......................... 2009 1 0201904

(51) Int. Cl.
  *H01F 5/00* (2006.01)
  *H01F 27/28* (2006.01)
(52) U.S. Cl.
  USPC ........................... 336/200; 336/223; 336/232
(58) Field of Classification Search .................. 336/200, 336/222, 232, 192; 29/602.1, 606, 607
  See application file for complete search history.

(56) References Cited

U.S. PATENT DOCUMENTS

| | | | |
|---|---|---|---|
| 5,656,849 A * | 8/1997 | Burghartz et al. | ............. 257/528 |
| 6,380,835 B1 | 4/2002 | Lee | |
| 6,853,267 B2 | 2/2005 | Chiba et al. | |
| 7,633,368 B2 * | 12/2009 | Lee | ................. 336/200 |
| 7,663,463 B2 | 2/2010 | Lin et al. | |
| 7,692,511 B2 | 4/2010 | Degani et al. | |
| 2004/0108933 A1 | 6/2004 | Chen et al. | |
| 2004/0108935 A1 | 6/2004 | Kyriazidou | |
| 2004/0140528 A1* | 7/2004 | Kim et al. | ....................... 257/537 |
| 2005/0093668 A1* | 5/2005 | Bueyuektas et al. | ........... 336/200 |
| 2005/0104158 A1 | 5/2005 | Bhattacharjee et al. | |
| 2006/0284718 A1* | 12/2006 | Baumgartner et al. | ....... 336/223 |
| 2007/0001796 A1 | 1/2007 | Waffenschmidt et al. | |
| 2007/0120637 A1* | 5/2007 | Ezzeddine | ..................... 336/200 |
| 2008/0006882 A1 | 1/2008 | Huang | |
| 2009/0003191 A1 | 1/2009 | Inuzuka et al. | |
| 2010/0026368 A1 | 2/2010 | Tang et al. | |
| 2010/0052839 A1 | 3/2010 | Mertens et al. | |

FOREIGN PATENT DOCUMENTS

JP  2007-123802 A  5/2007

* cited by examiner

*Primary Examiner* — Mohamad Musleh
*Assistant Examiner* — Mangtin Lian
(74) *Attorney, Agent, or Firm* — Ming Chow; Sinorica, LLC

(57) ABSTRACT

A stacked inductor with different metal thickness and metal width. The stacked inductor comprises top and bottom metal traces which are aligned with each other. The thickness and width of the top and bottom metal traces are different. The top and bottom metal traces are connected at the end of metal trace with via holes. The inductance is increased with the use of the mutual inductance between top and bottom metal layers The parasitic resistor is reduced due to the difference of the top and bottom metal widths.

4 Claims, 4 Drawing Sheets

Port 1

Port 2

Port 1

Port 2

Thick top metal trace with narrower metal width

Thin bottom metal trace with wider metal width

STACK INDUCTOR WITH DIFFERENT METAL THICKNESS AND METAL WIDTH

The current invention claims a foreign priority to the China application number 200910201904.X filed on Dec. 8, 2009.

FIELD OF THE INVENTION

The invention relates to micro-electronics and more particularly to realizing high Q on-chip stacked inductor for RF application.

BACKGROUND OF THE INVENTION

In present, there are a lot of passive devices in the integrated circuits. One of the most important components in RF CMOS/BiCMOS integrated circuits is on-chip inductor. Inductor has great impact on the RF characteristic in common wireless products. The design and analysis for this component has been widely researched as a result. Nowadays, the high Q on-chip inductor has been widely used in voltage controlled oscillator, low noise amplifier and other RF building blocks. On-chip stacked inductor reduced chip area in a large extent, which reduced the production cost.

Q factor is the major specification of inductor, high Q means low loss and high efficiency.

In traditional logic and RF process, because the thickness of top metal is larger than that of the bottom layers, the parasitic resistance of bottom metal is higher than that of top metal in stacked inductor. Conventional stacked inductor is shown in FIG. 1; the metal width and space are kept the same at different layers, possessing large inductance. However, the parasitic resistance and capacitance lead to decrease of Q factor and Self Resonance Frequency. As a result, it could not meet the requirement of circuit design.

SUMMARY OF THE INVENTION

This invention provides a stacked inductor with different metal thickness and metal width, which possesses larger inductance than single layer spiral inductor with the same area, and with a relative high Q factor.

This stacked inductor with different metal thickness and metal width comprised with top and bottom metal trace, which are aligned with each other. The thickness and width of top and bottom metal trace are different. The top and bottom metal trace are connected at the end of metal trace with via holes.

The advantages of this invention are: with this invention can increase inductance value at same chip area with the mutual inductance between top and bottom metal, and can reduce the resistance of bottom metal with larger metal width. This invention can increase inductance in large extent, and can keep high Q factor.

BRIEF DESCRIPTION OF THE DRAWINGS

These and other features of this invention will be more readily understood from the following detailed description of the invention with the accompanying drawings in which.

DETAILED DESCRIPTION OF THE INVENTION

Q factor is derived by:

$$Q \approx \frac{wL}{R_s} \quad \text{(Equation 1)}$$

Q is quality factor, w is frequency, L is inductance under a certain frequency, Rs is resistance under a certain frequency. The mutual inductance of the top and bottom metal trace efficiently improves the total inductance in a large extent, and, the ΔRs (increased parasitic resistance) is reduced by using larger metal width of bottom metal trace.

This stacked inductor with different metal thickness and metal width consists of two or more metal layers, this structure includes: top and bottom metal trace, which is aligned with each other. The thickness and width of top and bottom metal trace are different. The top and bottom metal trace are connected at the end of metal trace with via holes.

Figure 1:
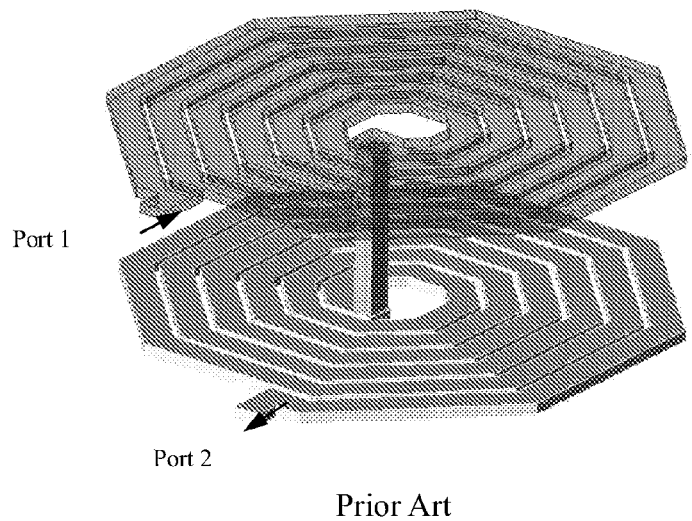
FIG. 1 is the schematic diagram of conventional stacked inductor.
Figure 2:
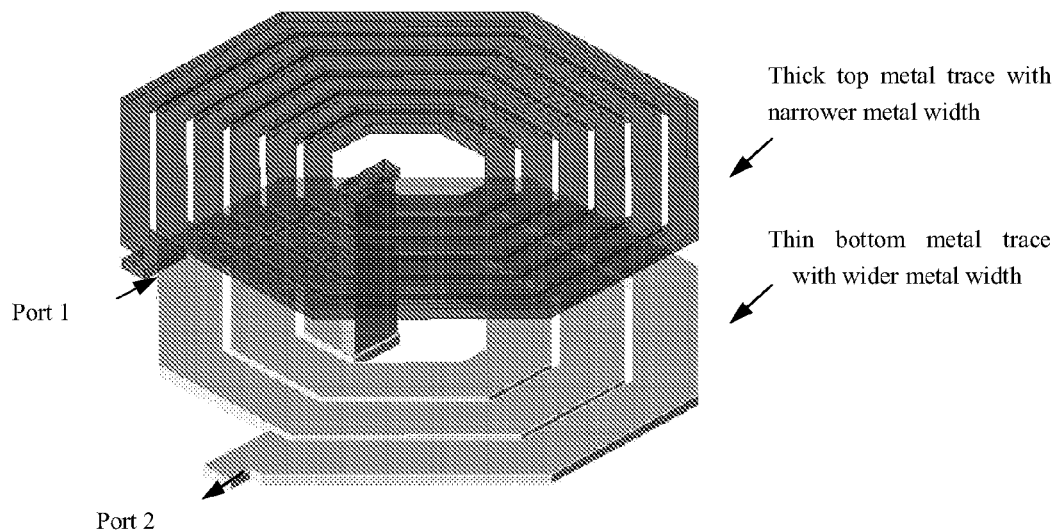
FIG. 2 is the schematic diagram of stacked inductor in this invention.

To make things more detailed, the layout of stacked inductor with different metal thickness and metal width (take two layers, octagonal stacked inductor for example) are shown in FIG. 2. From schematic diagram in FIG. 2, the width of bottom metal trace is larger than that of top trace and the edges of metal trace are aligned with each other. The top metal is thicker than bottom metal. The inductor is started from one port on top metal and spires in clockwise direction, the bottom layer keeps the same style and these two layers are connected through via holes at the end of inner port, and take the outer port on bottom layer as the other port of inductor.

The novel structure inductor can enlarge inductance value at same chip area with the mutual inductance between top and bottom metal, and can reduce the resistance of bottom metal with larger metal width. This invention can increase inductance in large extent, and can keep high Q factor.

Figure 4:
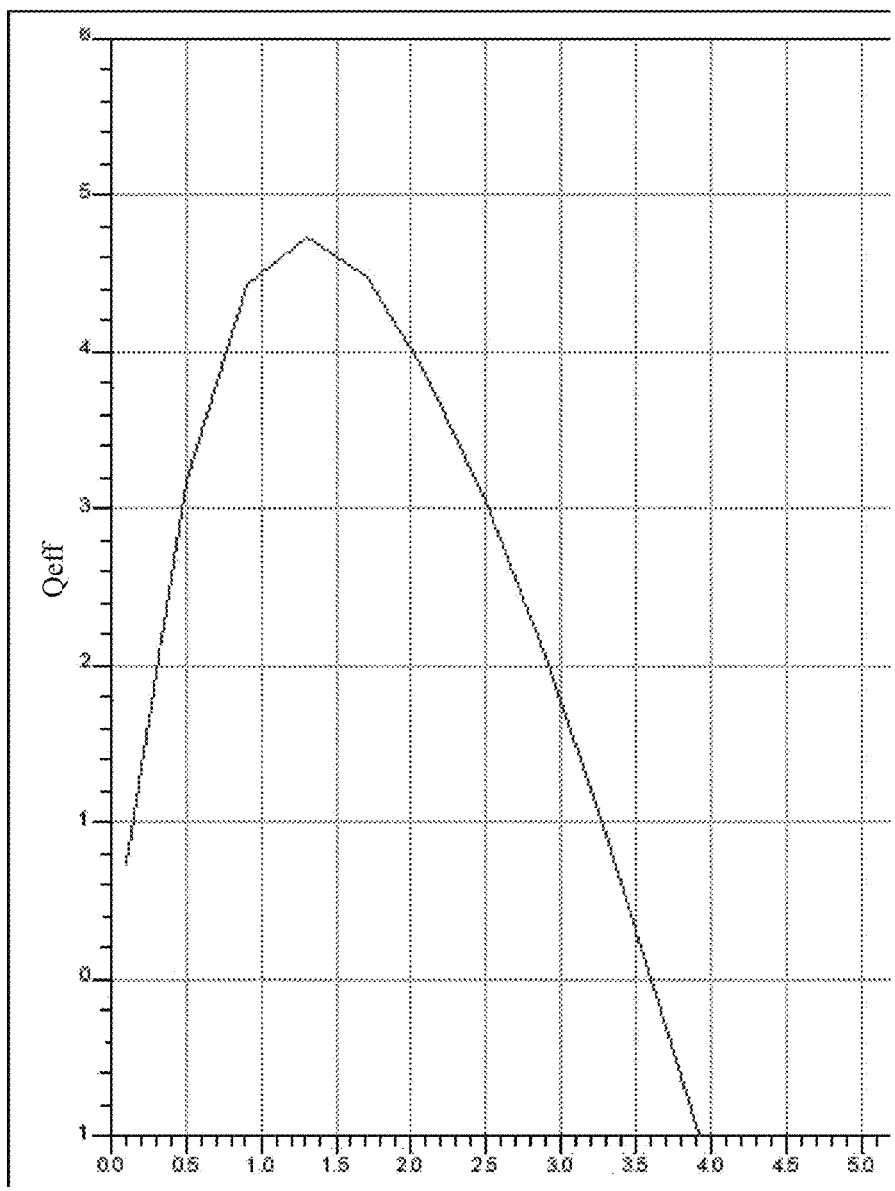
FIG. 4 is simulated Q vs frequency character of conventional stacked inductor.
Figure 5:
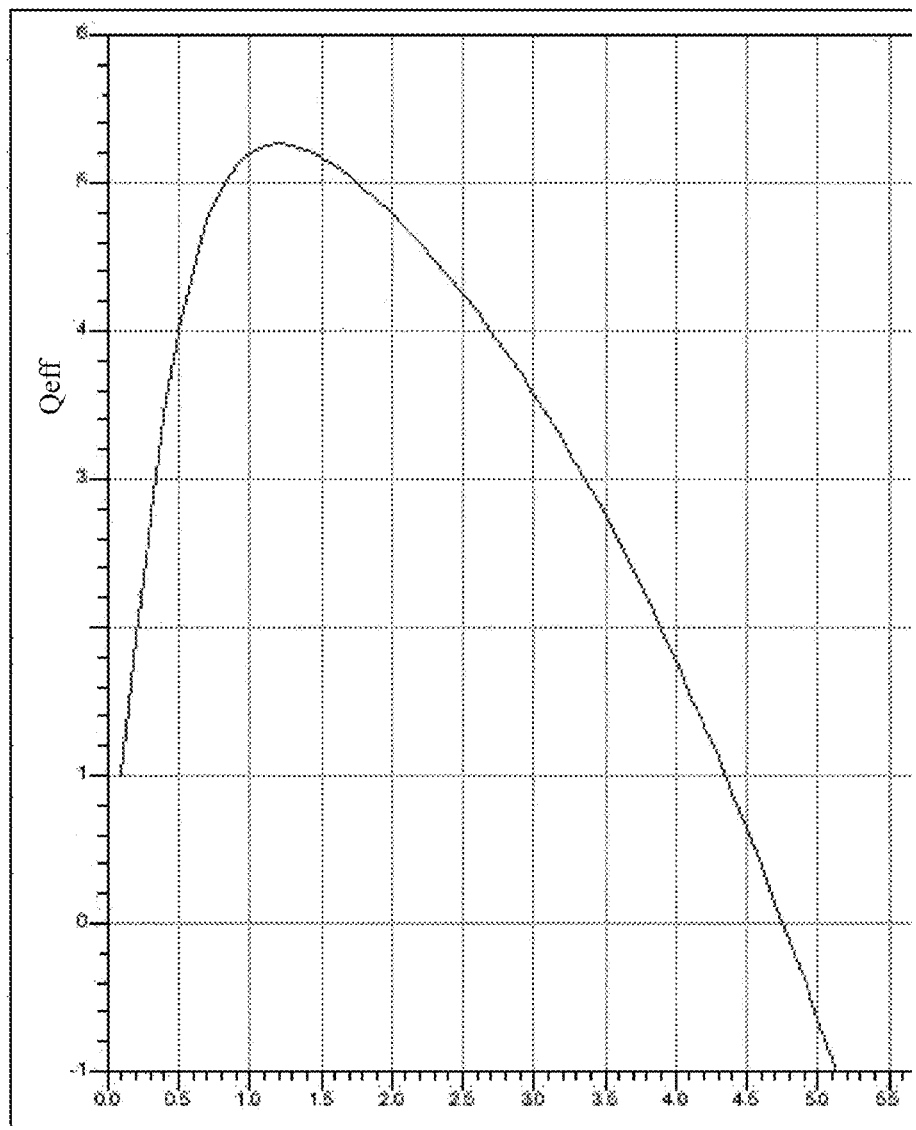
FIG. 5 is simulated Q vs frequency character of this invention.

Take a two layers stacked inductor with outer diameter 160 um as example, shown in FIG. 2. The top metal width is 8 um, space is 2 um, 6 turns, and thickness is 3 um. The bottom metal width is 18 um, space is 2 um, 3 turns, and thickness is 0.6 um. The Q factor of the new structure stacked inductor is improved more than 10% and SRF is improved more than 30% from FIGS. 4 and 5.

Figure 3:
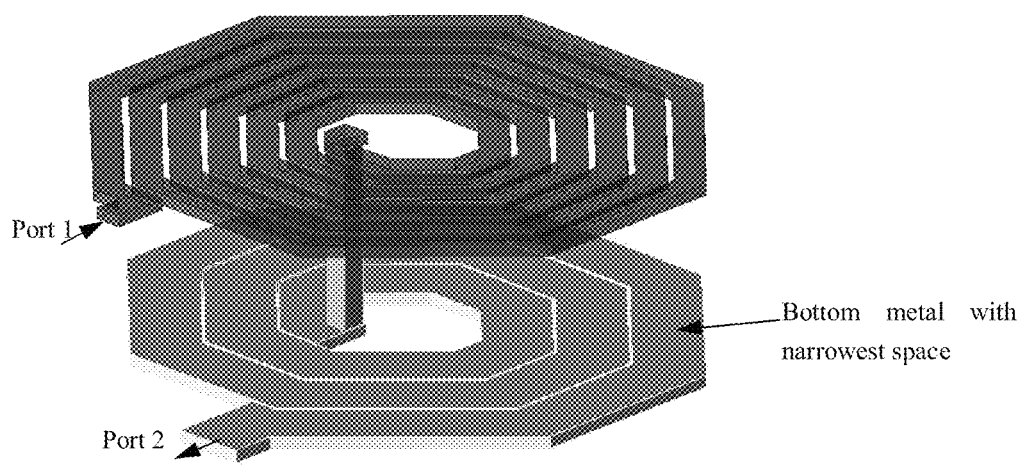
FIG. 3 is the schematic diagram of stacked inductor with the decreased space of bottom metal.

A improved structure is shown in FIG. 3, as the metal layers under top layer is thin metal, the space between metal trace of bottom metal can be smaller than that of top metal and can be the smallest value which are defined in the process layout rule to improve the inductance of bottom metal.

The new structure of this invention is not limited to two metal layers. The multi layers stacked inductor with different metal thickness can also improve the Q factor and L value through widening the width of bottom metal trace which are thinner than top metal. Through this method, an inductor with high inductance and relative high Q factor can be obtained. This invention is preferentially applied to the top metal layer and top minus one layer. However, other layers are also suitable for use.

While the invention has been particularly shown and described with reference to the preferred embodiments thereof, it will be understood by those skilled in the art that various changes in form and details may be made without departing from the spirit of the invention or from the scope of the appended claims.

The invention claimed is:

1. A stacked inductor with multiple layers of different metal thickness and metal width comprises:
   a top metal trace with a first predetermined width;
   the inductor starting from an outer port of metal coil on the top metal trace;
   a bottom metal trace with a second predetermined width;
   the top metal trace is connected to the bottom metal trace at an inner port through via holes;
   the bottom metal trace comprises an outer port wherein the outer port of the bottom trace being a port of the inductor;
   edges of the top and the bottom metal traces being aligned to each other;
   the thickness of the top metal trace is larger than the thickness of the bottom metal trace;
   a maximum second predetermined width is larger than a maximum first predetermined width;
   a maximum space between metals of the top metal trace is larger than a maximum space between metals of the bottom metal trace;
   the top and bottom metal traces being connected; and
   the stacked inductor is spired and the shape of the stacked inductor is selected from the group consisting of octagon, polygon and circle.

2. The stacked inductor with multiple layers of different metal thickness and metal width of claim 1 comprises: the top metal trace and the bottom metal trace comprises of two or more metal layers.

3. The stacked inductor with multiple layers of different metal thickness and metal width of claim 1 comprises: the quantity of turns of the top metal trace is different from the quantity of turns of the bottom metal trace.

4. The stacked inductor with multiple layers of different metal thickness and metal width of claim 1 comprises: the top metal trace and the bottom metal trace are wound in clockwise or counterclockwise direction.

* * * * *